US006459089B1

(12) United States Patent
Masefield et al.

(10) Patent No.: US 6,459,089 B1
(45) Date of Patent: Oct. 1, 2002

(54) SINGLE ACCELERATOR/TWO-TREATMENT VAULT SYSTEM

(75) Inventors: John Masefield, Far Hills, NJ (US); Charles P. Truby, Wilmington, NC (US); Jerome A. Dzwierzynski, LaGrange Park, IL (US)

(73) Assignee: Steris Inc., Temecula, CA (US)

( * ) Notice: Subject to any disclaimer, the term of this patent is extended or adjusted under 35 U.S.C. 154(b) by 0 days.

(21) Appl. No.: 09/518,417

(22) Filed: Mar. 3, 2000

(51) Int. Cl.[7] ........................ G21F 7/005; G01N 21/003; G21K 1/04; H01J 37/00

(52) U.S. Cl. ............................. 250/453.11; 250/454.11; 250/455.11; 250/492.1; 250/492.3

(58) Field of Search ........................... 250/492.1, 492.2, 250/492.22, 423 R, 307, 308, 309, 385.1, 453.11, 454.11, 455.11, 492.3

(56) References Cited

U.S. PATENT DOCUMENTS

| | | | | |
|---|---|---|---|---|
| 2,602,751 A | | 7/1952 | Robinson | |
| 3,452,195 A | | 6/1969 | Brunner | |
| 3,564,241 A | | 2/1971 | Ludwig | |
| 3,676,675 A | | 7/1972 | Ransohoff et al. | |
| 4,209,704 A | * | 6/1980 | Krimmel | 250/423 R |
| 4,561,358 A | | 12/1985 | Burgess | |
| 4,740,694 A | * | 4/1988 | Nishimura et al. | 250/306 |
| 4,852,138 A | | 7/1989 | Bergeret et al. | |
| 5,004,926 A | * | 4/1991 | Vassenaix et al. | 250/492.3 |
| 5,051,585 A | * | 9/1991 | Koshishiba et al. | 250/306 |
| 5,053,627 A | * | 10/1991 | Ruffell et al. | 250/492.2 |
| 5,396,074 A | | 3/1995 | Peck et al. | |
| 5,994,706 A | | 11/1999 | Allen et al. | |
| 6,191,424 B1 | * | 2/2001 | Stirling et al. | 250/455.11 |
| 6,236,055 B1 | * | 5/2001 | Williams et al. | 250/492.3 |
| 6,285,030 B1 | * | 9/2001 | Williams et al. | 250/454.11 |
| 6,294,791 B1 | * | 9/2001 | Williams et al. | 250/455.11 |

OTHER PUBLICATIONS

J. Williams, "Weighing the Choices in Radiation Sterilization: Electron–Beam and Gama," *Medical Device & Diagnostic Industry*, Mar. 1995.

Corporate Profile Advertisement, "Electron Beam Sterilization Comes to the Midwest," *Canon Communications, Inc.*, 1995.

* cited by examiner

*Primary Examiner*—John R. Lee
*Assistant Examiner*—David A. Vanore
(74) *Attorney, Agent, or Firm*—Fay, Sharpe, Fagan, Minnich & McKee, LLP

(57) ABSTRACT

A particle accelerator (10) is disposed between a first shielded processing chamber (12)and a second shielded processing chamber (14). The accelerator selectively feeds a higher energy (e.g., 10 MeV) electron beam to the first processing chamber and selectively feeds a lower energy (e.g., 5 MeV) electron beam to the second processing chamber. A conveying system (16) transports article carriers to and through the first processing chamber. At a processing table (18), the articles are conveyed at a closely controlled speed through the electron beam for uniform dosing of an article to be irradiated. A loading station (20) and an unloading station (22) supply and remove articles from the first processing chamber. Beam bending magnets (44) change the direction of an electron beam between the first processing chamber and the second processing chamber. A second conveying system, such as a reel-to-reel system (40) for processing articles of indefinite length transported on reels and rolls, conveys articles through the second processing chamber.

23 Claims, 7 Drawing Sheets

SINGLE ACCELERATOR/TWO-TREATMENT VAULT SYSTEM

BACKGROUND OF THE INVENTION

The present invention relates generally to irradiation systems. The invention finds particular relation to an irradiation system in which an accelerator selectively supplies electron beams to either of a pair of processing chambers and will be described with particular reference thereto. It is to be appreciated that the invention will also find application in other radiant energy systems.

Irradiation systems are used for irradiating articles, such as foodstuffs, food utensils, medical devices, consumer goods, cosmetics, and waste products and their containers, with high energy electromagnetic radiation, such as an electron beam, x-rays, and microwaves, for various purposes including sterilizing or disinfecting such articles. Articles are also irradiated in conjunction with cross polymerization of plastics and other material.

Heretofore, articles have been irradiated by utilizing a treatment application system that includes a radiation source, a plurality of article carriers, and a process conveyor for transporting the article carriers past the radiation source. The radiation source is mounted, for example, perpendicular to the conveyor along an approximately horizontal axis to irradiate the articles as they are transported past the radiation source.

In some systems, the article carriers are suspended from a power-and-free overhead conveyor. After the article carrier has been transported past the radiation source, some systems rotate the article carrier 180° and transport the reoriented article carrier past the radiation source again. In this manner, the irradiation during the initial transportation past the radiation source is symmetrically balanced. In one prior system, the article carrier is suspended from the power-and-free conveyor track at both its leading and trailing ends. It is reoriented by diverting the leading end to an unpowered branch track that loops off to one side and then rejoins the main track. The trailing end moves along the powered main track so that the trailing end takes the lead and pulls the diverted end from the branch track to the main track in a trailing position.

Other systems utilize a radiation source, article carriers, and several inverted conveyor systems (i.e., the chain is on the bottom of the conveyor). The conveyor system includes transport conveyors for loading/unloading, a process conveyor, and a stabilizing conveyor to stabilize movement of the article carrier. The transport conveyor transfers the carrier directly to the process conveyor.

However, existing systems do not provide for irradiating at different energy levels or in two different processing chambers using one centrally located accelerator.

Accordingly, it has been considered desirable to develop a new and improved irradiation system which would overcome the foregoing difficulties and others and which would produce better and more advantageous overall results.

SUMMARY OF THE INVENTION

In accordance with one aspect of the present invention, an irradiation system comprises a radiation source, a first processing chamber positioned adjacent the radiation source, and a second processing chamber positioned adjacent an opposite side of the radiation source. The first processing chamber and the second processing chamber are positioned opposite each other. The radiation source selectively feeds an electron beam to one of the processing chambers and selectively feeds an electron beam of a different energy level to the other of the processing chambers.

The radiation source provides an electron beam of a high energy level, such as 10 MeV, to the first processing chamber. The radiation source provides a low energy level electron beam, such as 5 MeV, to the second processing chamber. The 10 MeV and 5 MeV beams are not provided simultaneously. The radiation source further includes a rotary particle accelerator and beam bending magnets which change the direction of an electron beam generated by the particle accelerator between the first processing chamber and the second processing chamber when selected.

A conveying system is provided for transporting article carriers through the first processing chamber. The conveying system comprises a code system for tracking articles as they are transported through the first processing chamber.

A reel-to-reel system is provided for feeding articles of indefinite length through the second processing chamber.

One advantage of the present invention is that it reduces accelerator costs when there is a need for two accelerators (5 MeV and 10 MeV) at a single location.

Another advantage of the present invention is that it provides multiple energy levels, such as a 10 MeV electron beam and a 5 MeV electron beam.

Yet another advantage of the present invention is that it reduces reconfiguring time and cost for processing different types of articles by quick switching between 10 MeV treatment and the 5 MeV treatment.

Still another advantage of the present invention is that it reduces down time due to set up and preparation.

Yet still another advantage of the present invention is that medical products and food can be processed in the 5 MeV vault.

Still other advantages and benefits of the invention will become apparent to those skilled in the art upon a reading and understanding of the following detailed description.

BRIEF DESCRIPTION OF THE DRAWINGS

The invention may take physical form in certain parts and arrangements of parts. The drawings are for purposes of illustrating a preferred embodiment and are not to be construed as limiting the invention.

DETAILED DESCRIPTION OF THE PREFERRED EMBODIMENT

Figure 1:
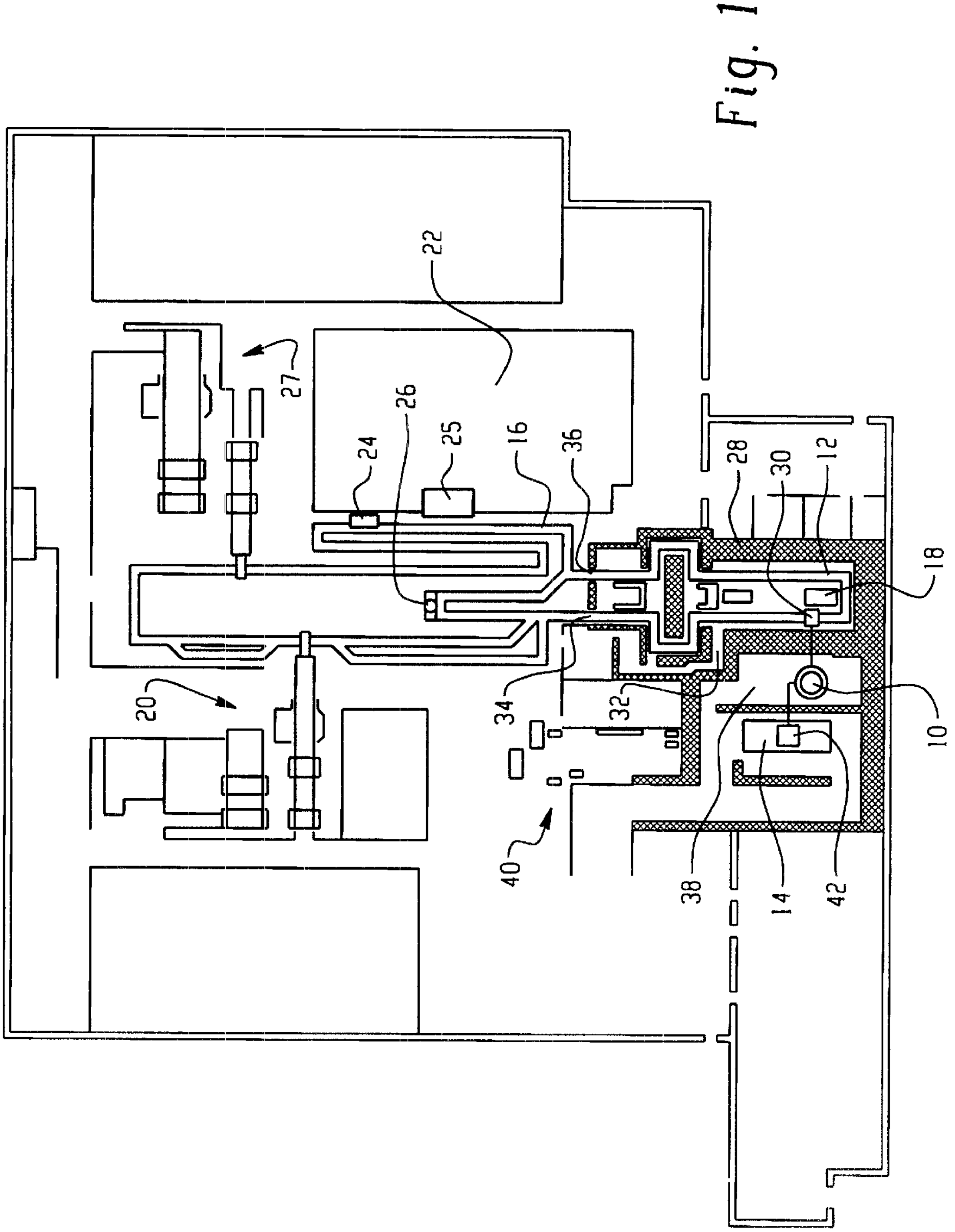
FIG. 1 is a plan view of a single accelerator and two-treatment vault system in accordance with a preferred embodiment of the present invention.

With reference to FIG. 1, a centrally located particle accelerator 10, preferably a Rhodotron™electron accelerator, selectively feeds electron beams to a plurality of destinations. The accelerator is tapped such that different beams have different energies.

In a preferred embodiment, a 10 MeV beam is delivered to a first processing vault 12; and a 5 MeV beam is provided to a second processing vault 14. The first processing vault 12 is positioned adjacent the accelerator 10 on one side of the accelerator. The second processing vault 14 is positioned adjacent the accelerator 10 on an opposite side of the accelerator. Optionally, additional vaults can be provided.

One advantage of using two different vaults, a 10 MeV vault and a 5 MeV vault, is that one accelerator can be used for irradiating different types of articles without the need for reconfiguring a processing vault for irradiating different types of articles. Medical devices can be irradiated with the 10 MeV system without the potential for contamination of the medical device by other items using either the 10 MeV system or the 5 MeV system. Conversely, the 5 MeV system is used for industrial products without potential for contamination to either the industrial products or medical products.

Figure 2:
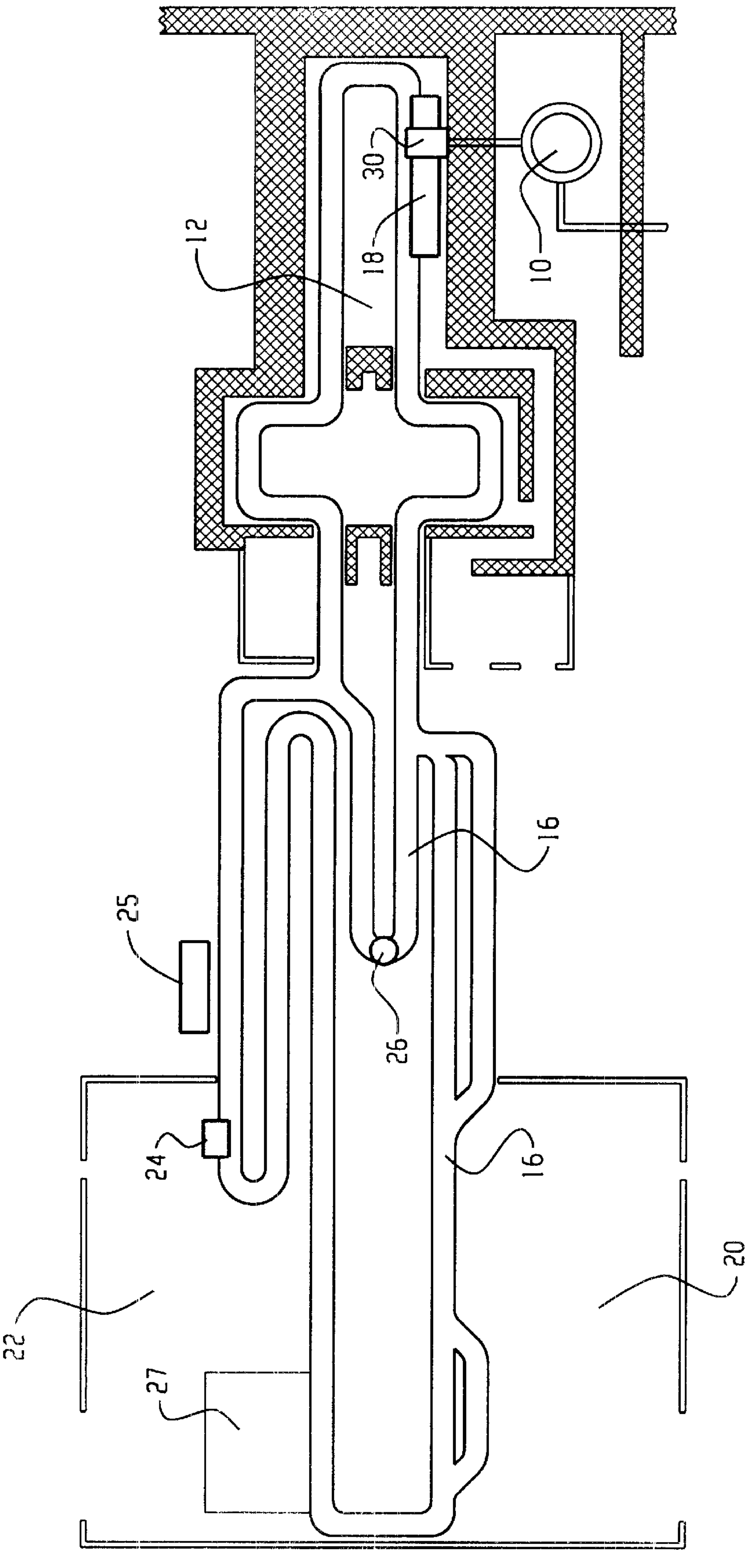
FIG. 2 is a plan view of the conveying system for the 10 MeV vault of FIG. 1.

With particular reference to FIG. 2, the 10 MeV electron beam irradiation system includes the accelerator 10, the first processing vault 12, a product conveying system 16 with a separate process table 18, an inbound product loading non-processed area 20 and an outbound processing storage and unloading area 22 and a process control system (not shown). The system processes carriers 24 of articles stacked on slave pallets by exposing the articles to a controlled source of electrons generated by the electron beam accelerator 10.

The article carriers 24 are slaved to the power and free conveying system 16, and they receive and transport the individual slave pallets with product through the first processing chamber 12. The conveying system 16 transports the carriers 24 into and out of the first processing chamber 12. Each article carrier 24 is identified by a unique license plate that allows for tracking that specific carrier throughout the entire system. The slave pallets are typically made of mild steel. The accelerator 10 is slaved to the conveyor system 16 speed. Thus, if the conveyor system 16 speed varies, the beam power of the accelerator 10 is adjusted accordingly. Alternatively, the accelerator 10 has a set parameter to which the conveyor speed is adjusted as the carrier passes the accelerator.

Articles on the slave pallet are stretch-wrapped to ensure their loading integrity and proper orientation to the electron beam. The loaded slave pallet is then transferred to the main conveying system 16 where a coding system 25 tracks the articles by bar code marks on the articles as they move through the system, as well as establishing the correct operating parameters for the process table 18 and accelerator 10. The bar code mark is a label affixed to the articles which list customer and quality assurance information. The information is downloaded into a computer to generate a certificate of processing after irradiation.

In a preferred embodiment, the pallets are 105 cm long by 90 cm wide. Articles are stacked on the slave pallets, e.g., to a height of 180 cm. The slave pallets are removed from the unloading area 22 and are transferred by a forklift back to the loading area 20 where they index into the product palletizer.

For the 10 MeV system, articles are loaded onto slave pallets in a warehouse storage area, the slave pallets are transferred to the carriers 24, and the carriers 24 are automatically conveyed by the conveyor system 16 into the first processing chamber 12. The process control system assures that the speed of the process table 18 and the power of the beam are each set to assure the correct radiation dose. This system provides a redundant monitorying of speed and beam power for validation purposes. The process table 18 is positioned inside the first processing chamber 12 to ensure uniform dosing in front of the electron beam. If double-sided irradiation is required, the system moves the slave pallets to a rotating mechanism 26 that provides a 180-degree article orientation. A different slave pallet is returned to the vault for irradiation. The different slave pallet is used as a way to document that the product was rotated.

The product slave pallets are then transported to the processed storage and unloading area 22 for unloading. The carriers 24 and empty slave pallets are transferred back to the loading station 20.

In the processed storage area 22, the slave pallets are transferred to an unloading station 27 where stretch-film is removed and the product is configured for shipment back to the customer. A barrier fence separates a non-irradiated storage area from an irradiated storage area to assure that product must pass through the electron beam to reach the irradiation area.

With reference again to FIG. 1, a radiation shield 28, e.g., of concrete about 3 meters thick, encloses the entire processing area that houses an electron scan horn 30 of the accelerator 10 and the process table 18. The radiation shield 28 is designed to reduce the energy of 10 MeV x-rays generated in the processing area to an outside average exposure rate of less than 0.25 mrem/hour. This allows a person who works near the shield forty hours per week an accumulative exposure level of approximately 500.0 mrem per year.

Personnel and product enter the first processing chamber 12 through mazes that protect shield integrity and prevent the leakage of radiation. Personnel can enter through an access passage 32 when the radiation is off. Product is transported by the conveyor system 16 through a separate entry port 34 and exit port 36.

Figure 3:
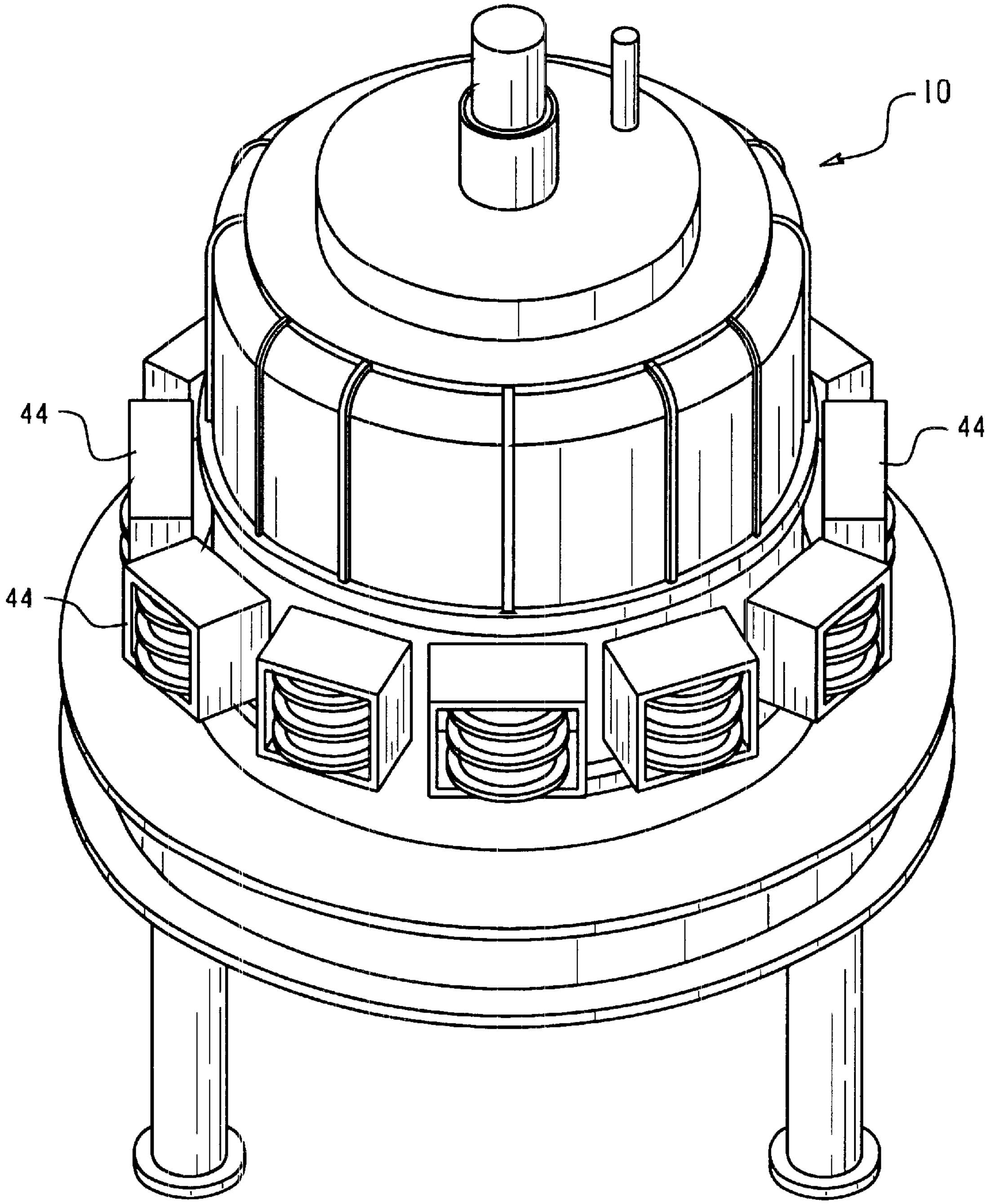
FIG. 3 is a cross-sectional perspective view of a Rhodotron™ accelerator of the system of FIG. 1.

With reference to FIG. 3, the accelerator 10 produces 80 kW of power and 8 mA of current to generate the 10 MeV electron beam. This power represents throughput capacity equivalent to approximately seven million curies of cobalt radioisotope. Located in its own concrete enclosure or vault 38, the accelerator 10 generates electrons. The electrons are magnetically accelerated spiraling outward with increased energy. At the radius corresponding to the selected energy, the electrons are magnetically deflected into evacuated tubes. Magnets along the tubes guide the electron beam through the tubes without impacting the walls to the scan horn 30. When the electron beam reaches the scan horn 30, it is magnetically deflected into a planar fan that emerges from a window of the scan horn and passes into the first processing vault 12. The entire accelerator, beam line and scan horn are maintained under deep vacuum to assure beam integrity and uniformity. An accelerator control system is set in order to deliver electron current at multiple levels, providing a wide range of processing capability.

With reference again to FIG. 1, for 5 MeV processing, a reel-to-reel conveying system 40 is used in one embodiment to process industrial products such as wire, cable, tubing or other products that are stored and transported on reels or rolls. The 5 MeV vault has a large opening to allow for large items to be driven on a forklift into the irradiation chamber. The reel-to-reel system 40 is used for industrial products of indefinite length and allows the 5 MeV vault to be smaller than if a bulky pallet conveying system was used. A second conveying system is used in combination with the reel-to-reel system 40 to process articles through the second processing chamber 14. The reel-to-reel system 40 is slid away from the scan horn 30 when a processing table (not shown) is moved into place. The articles to be irradiated are transferred from the reel-to-reel system 40 to the second conveying system.

The system consists of payoff and take-up stands, a dual drum capstan within the second processing chamber 14, and various adjustable tensioning and guide roller assemblies. The system preferably processes products ranging in diameter from about 1 cm to about 4 cm. Automated processing controls in conjunction with the accelerator 10 at the 5 MeV energy level allow the system to deliver very precise dose ranges.

A separate scan horn 42, vertically positioned, is used with the accelerator 10 for the 5 MeV system. The scan horn 30 is horizontally positioned and approximately along the same plane as the first and second processing chambers 12, 14.

The process of changing from 10 MeV to 5 MeV is accomplished by turning off one beam bending magnet 44 (shown in FIG. 3). The ability to switch back and forth between the two processing chambers 12, 14 provides the advantage of allowing workers to set up and prepare one of the vaults while the other vault is being used to irradiate articles. The shielding between the two chambers is sufficient to allow workers to be within one chamber while the other chamber is supplying electron beams to articles without exposing the workers to unacceptable radiation levels.

Switching the accelerator 10 between the two vaults 12, 14 can be done very quickly, typically in less than five minutes, using a computer control system. Thus, there is a minimal amount of downtime when switching between the 10 MeV system and the 5 MeV system. Switching to the 10 MeV energy level is accomplished when the accelerator operator selects the desired beamline via a computer. The computer program to select the beamline is well known in the industry.

The magnet system for the 10 MeV beam line is computer controlled. Set points are selected for a steering magnet and a scanning magnet positioned between the accelerator and the scan horn. To switch to the 10 MeV system, a bending magnet 44 is turned on and is used to provide the beamline to the 10 MeV vault. Similarly, parameters for a scanning magnet and a steering magnet are selected for the 5 MeV beam line.

The accelerator magnet system is also computer controlled. The various magnet parameters are changed or set by a computer control screen for the 10 MeV energy level or the 5 MeV energy level. The operation of the magnets for either the 10 MeV or 5 MeV systems are selected on a separate computer screen.

Figure 4A:
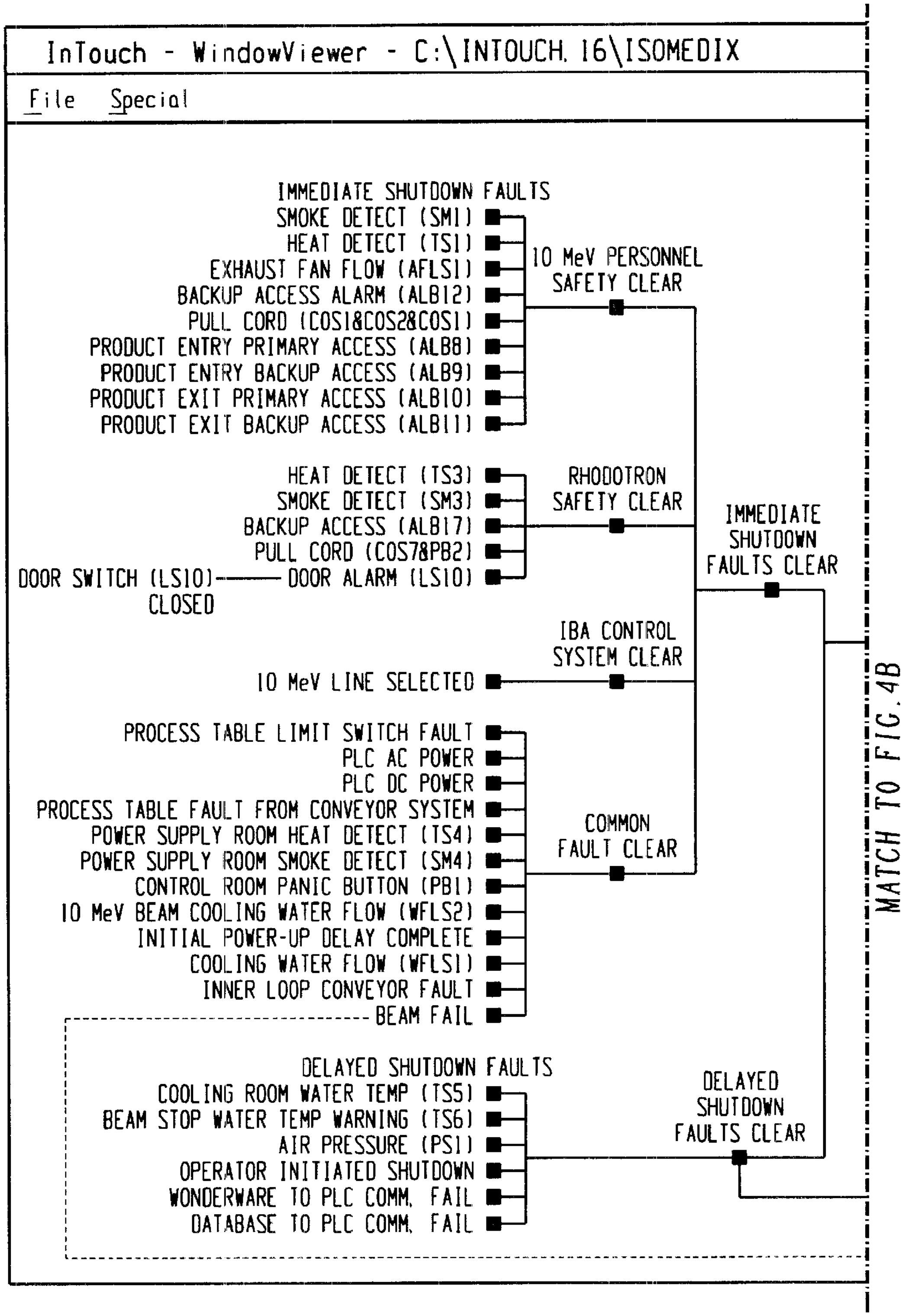
FIG. 4 is a computer screen for monitoring 10 MeV safety system status.
Figure 4B:
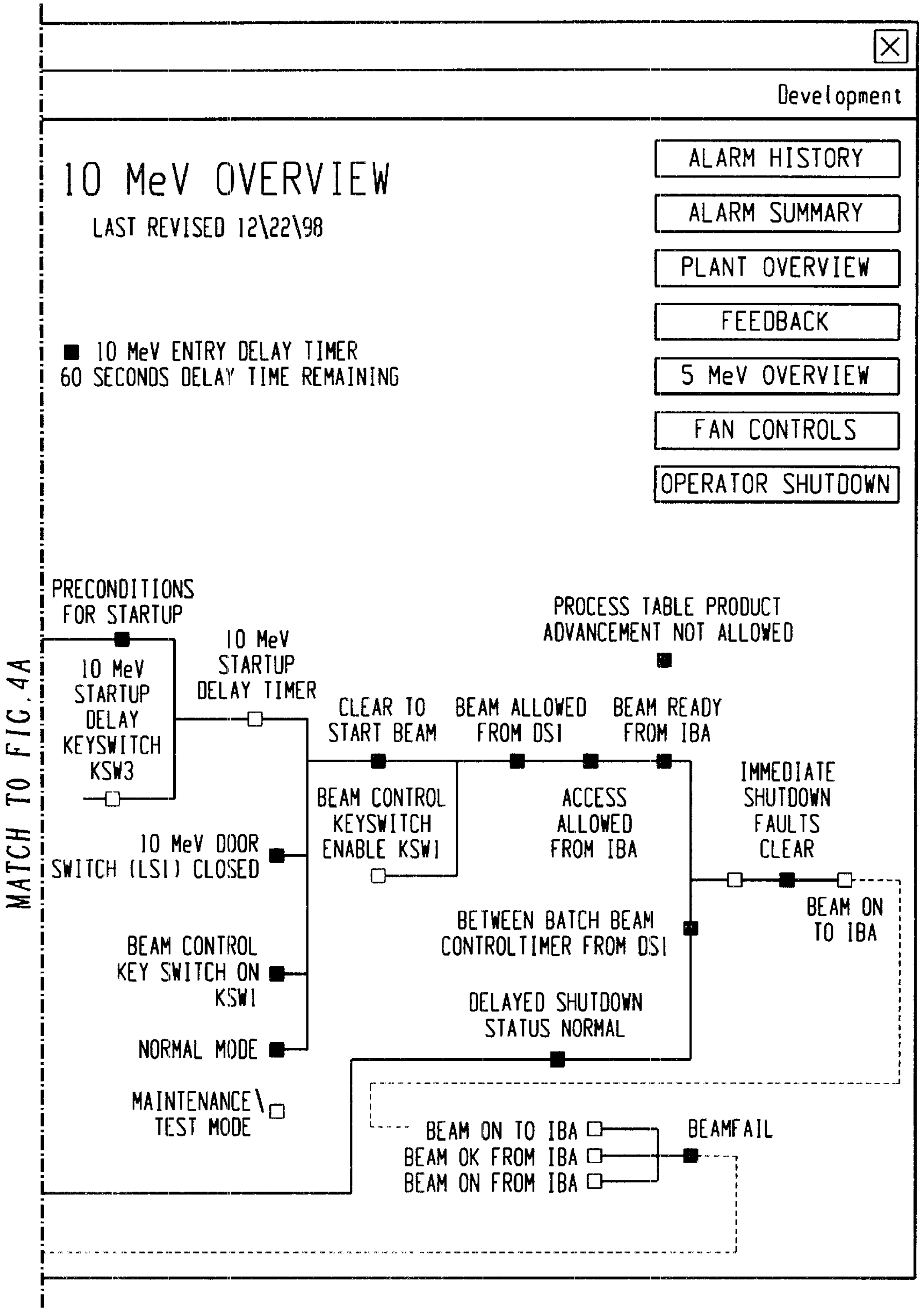

Referring now to FIG. 4, a computer controlled safety system is used to ensure that the 10 MeV system operates with minimal possibility for failure. A computerized audit is in place to control shutdown faults for personnel safety, accelerator safety, and common faults (e.g., power, water flow, etc.). Delayed shutdown fault audits are also in place such as a water temperature warning and an air pressure check. An audit is run anytime a breach occurs in any part of the system. For example, when the 10 MeV vault is entered or the accelerator is started up and provided power, the fault checks for these parts of the system are triggered.

Figure 5A:
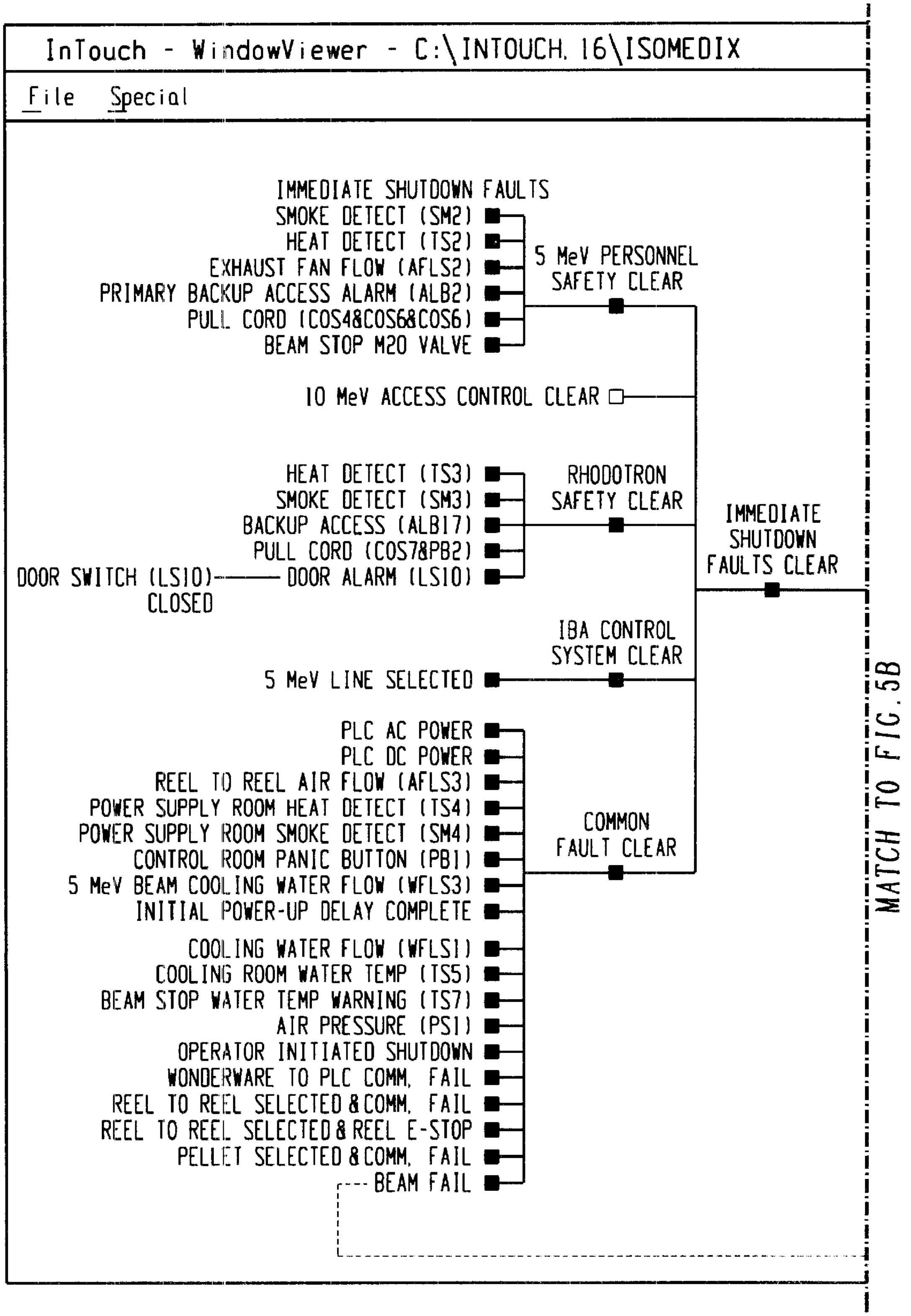
FIG. 5 is a computer screen for monitoring 5 MeV safety system status.
Figure 5B:
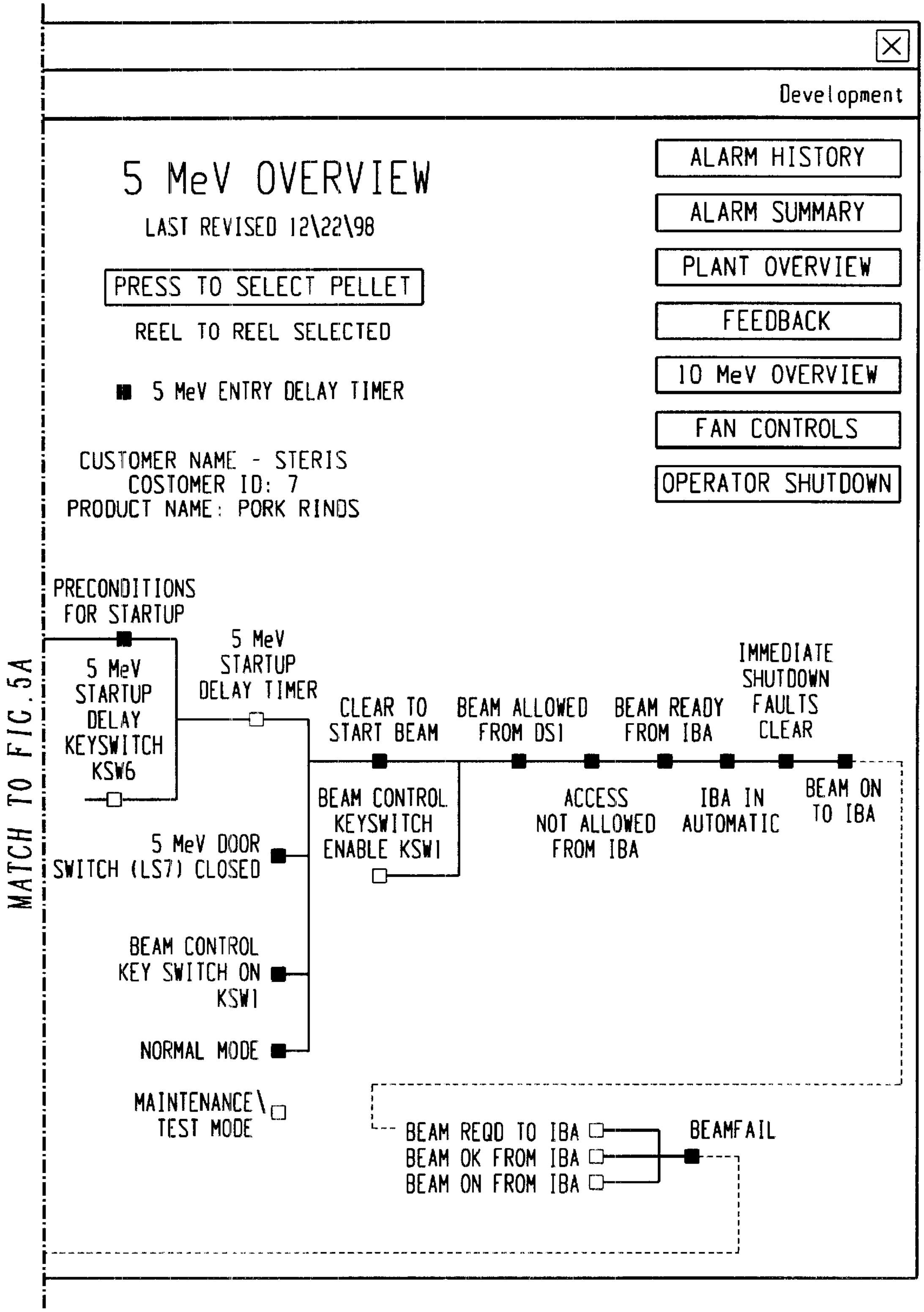

Referring to FIG. 5, a 5 MeV safety system is also computer controlled. Immediate shutdown fault audits are also in place for 5 MeV personnel safety, accelerator safety, the computer control system, and common faults. Also, beam stop cooling water flow and ozone removal fans in both the 5 MeV and 10 MeV vaults are interlocked through the computers to insure safe operation.

10 MeV safety system is active only when the 10 MeV beam is selected. The 5 MeV safety system is active only when the 5 MeV beam is selected.

The invention has been described with reference to the preferred embodiment. Obviously, modifications and alterations will occur to others upon a reading and understanding of this specification. It is intended to include all such modifications and alterations insofar as they come within the scope of the appended claims or the equivalents thereof.

Having thus described the invention, it is claimed:

1. An irradiation system comprising:

a radiation source;

a first processing chamber positioned adjacent said radiation source;

a second processing chamber positioned adjacent an opposite side of said radiation source, said first processing chamber and said second processing chamber are positioned opposite each other and are operable independent of each other;

said radiation source selectively feeds a first electron beam to said first processing chamber and a second electron beam of a different energy level to said second processing chamber.

2. The irradiation system of claim 1, wherein said radiation source provides a 10 MeV electron beam to said first processing chamber.

3. The irradiation system of claim 2, wherein said radiation source provides a 5 MeV electron beam to said second processing chamber.

4. An irradiation system comprising:

a common radiation source for radiation of a first energy level and second energy level;

first and second processing chambers disposed on opposite sides of said radiation source, the first processing chamber receiving radiation of the first energy level and the second radiation source receiving radiation of the second energy level;

a conveyor system for transporting article carriers into and through at least said first processing chamber;

a conveyor loading system which selectively loads and unloads articles to be irradiated with radiation of the first energy level onto and off of the conveyor system, the loading system being disposed outside of said processing chambers.

5. The irradiation system of claim 1, further including:

a processing table disposed in the first processing chamber adjacent a radiation beam directing scan horn for uniform dosing of said electron beam to said article to be irradiated.

6. The irradiation system of claim 1, wherein first processing chamber comprises a loading station and an unloading station for supplying and removing articles from said first processing chamber.

7. The irradiation system of claim 4, wherein said conveying system comprises a code system for tracking articles as they are transported through the first processing chamber.

8. The irradiation system of claim 1, wherein said radiation source further includes:

a rotary particle accelerator;

beam bending magnets which change the direction of an electron beam generated by the particle accelerator between said first processing chamber and said second processing chamber.

9. An irradiation system for treating articles of indefinite lengths with radiation, the system comprises:

a first processing chamber;

a second processing chamber positioned adjacent the first processing chamber;

a reel-to-reel system for feeding articles of indefinite length into and through the second processing chamber;

an electron beam source disposed adjacent both the first and second chambers to supply a first electron beam to said first processing chamber and a second electron beam of a different energy level to said second processing chamber to irradiate the articles of indefinite length as they pass through the second chamber.

10. The irradiation system of claim 1, further comprising a safety system which verifies that the first processing chamber and second processing chamber do not have faults in their respective systems.

11. An irradiation system comprising:

a first radiation shielded processing chamber;

a second radiation shielded processing chamber;

a particle accelerator which generates particle beams of different energy levels;

a first particle beam path leading from the accelerator to a first scan horn disposed in the first processing chamber to discharging a particle beam of a first energy level into a radiation processing region of the first chamber;

a second particle beam path leading from the accelerator to a second scan horn disposed in the second processing chamber to discharging a particle beam of a second energy level into a radiation processing region of the second chamber;

a deflector which selectively deflects a particle beam between the first and second particle beam paths;

said first processing chamber and said second processing chamber are operable independent of one another.

12. The irradiation system as set forth in claim 11 further including:

a first conveyor system for conveying articles to be irradiated into the first chamber, through the first chamber radiation processing region, and out of the first chamber.

13. The irradiation system as set forth in claim 12, wherein the first conveyor system includes a process region portion that moves the articles through the radiation processing region at controlled speed to assure uniform radiation dosage.

14. The irradiation system as set forth in claim 11, wherein the particle beam is a charged particle beam and the deflector includes a magnet for magnetically deflecting the beam between the first and second beam paths.

15. The irradiation system as set forth in claim 11, wherein the particle beam is an electron beam.

16. An irradiation system comprising:

a first radiation shielded processing chamber;

a second radiation shielded processing chamber;

a rotary charged particle accelerator which has at least a first discharge port which discharges electrons of a first energy level and a second discharge port which discharges electrons of a second energy level;

a first particle bean path leading from the first accelerator discharge outlet to a first scan horn disposed in the first processing chamber to direct an electron beam of the first energy level into a radiation processing region of the first chamber;

a second particle beam path leading from the second accelerator discharge outlet to a second scan horn disposed in the second processing chamber to direct acceleration of the second energy level into a radiation processing region of the second chamber.

17. The irradiation system as set forth in claim 16, wherein the deflector deflects electrons accelerated to a first energy into the first path and electrons accelerated to a second energy into the second path.

18. A method of irradiating articles comprising:

accelerating electrons;

forming the accelerated electrons into a first electron beam and directing the electron beam into a first radiation shielded chamber;

conveying articles to be irradiated through the first chamber;

directing the electron beam through the conveyed articles in the first chamber;

while directing the electron beam through the conveyed articles in the first chamber, setting up to convey different articles through a second radiation shield chamber;

conveying the different articles through the second chamber and forming the accelerated electrons into a second electron beam and directing the second electron beam to the second chamber and through the conveyed articles in the second chamber.

19. The method as set forth in claim 18, further including:

stopping the electron beam from entering the first chamber before directing the electron beam into the second chamber, and performing one of set-up, maintenance, and repairs in the first chamber.

20. The method as set forth in claim 18, wherein the first and second electron beams have different energies such that different irradiation treatments are carried out in the first and second chambers.

21. The irradiation system of claim 4, wherein said first and second processing chambers operate independently of each other.

22. The radiation system of claim 4, wherein said radiation source further includes:

a rotary particle accelerator;

beam bending magnets which deflect an electron beam of the first energy level in the first processing chamber and an electron beam of the second energy level to the second energy chamber.

23. The method as set forth in claim 18 wherein the first processing chamber is under atmospheric conditions and the articles are conveyed from outside the first chamber, into the first chamber and through the electron beam, and out of the first chamber during the irradiation process.

* * * * *